(12) United States Patent
Galy

(10) Patent No.: US 12,501,718 B2
(45) Date of Patent: Dec. 16, 2025

(54) ELECTROSTATIC DISCHARGE PROTECTION DEVICE

(71) Applicant: STMicroelectronics France, Montrouge (FR)

(72) Inventor: Philippe Galy, Le Touvet (FR)

(73) Assignee: STMicroelectronics France, Montrouge (FR)

( * ) Notice: Subject to any disclaimer, the term of this patent is extended or adjusted under 35 U.S.C. 154(b) by 516 days.

(21) Appl. No.: 18/096,160

(22) Filed: Jan. 12, 2023

(65) Prior Publication Data
US 2023/0268338 A1   Aug. 24, 2023

(30) Foreign Application Priority Data

Jan. 17, 2022   (FR) ..................................... 2200347

(51) Int. Cl.
*H10D 89/60*   (2025.01)

(52) U.S. Cl.
CPC ......... *H10D 89/814* (2025.01); *H10D 89/611* (2025.01)

(58) Field of Classification Search
CPC ............... H10D 89/814; H10D 89/611; H10D 30/6744; H10D 86/201; H10D 89/811; H10D 89/819
See application file for complete search history.

(56) References Cited

U.S. PATENT DOCUMENTS

| | | | | |
|---|---|---|---|---|
| 5,218,506 A | * | 6/1993 | Harris | H10D 89/811 361/90 |
| 2005/0013072 A1 | * | 1/2005 | Chuang | H03K 17/08104 361/56 |
| 2005/0180076 A1 | * | 8/2005 | Saito | H10D 89/811 361/91.1 |
| 2012/0307405 A1 | * | 12/2012 | Chen | H02H 9/046 361/56 |
| 2014/0092508 A1 | * | 4/2014 | Ko | H02H 9/046 361/56 |
| 2017/0338221 A1 | * | 11/2017 | Huang | H10D 89/811 |

(Continued)

FOREIGN PATENT DOCUMENTS

| | | |
|---|---|---|
| CN | 102340243 A | 2/2012 |
| CN | 109659303 A | 4/2019 |
| CN | 219832660 U | 10/2023 |

OTHER PUBLICATIONS

INPI Search Report and Written Opinion for priority application, FR 2200347, report dated Aug. 29, 2022, 8 pgs.

(Continued)

*Primary Examiner* — S M Sohel Imtiaz
(74) *Attorney, Agent, or Firm* — Crowe & Dunlevy LLC

(57) ABSTRACT

An electrostatic discharge protection device is formed using only electrically connected transistors. The transistors include: a first MOS-type transistor forming a clamping circuit coupled between first and second supply nodes; a second MOS-type transistor coupled between the first supply node and a gate terminal of the first MOS-type transistor; and a third MOS-type transistor having a first gate terminal coupled to a gate terminal of the second MOS-type transistor, a second gate terminal coupled to one of the first and second supply nodes, and first and second conduction terminals coupled to the second supply node.

18 Claims, 8 Drawing Sheets

(56) References Cited

U.S. PATENT DOCUMENTS

| | | | | |
|---|---|---|---|---|
| 2020/0177183 A1* | 6/2020 | Hegde | .................. | H03K 19/007 |
| 2020/0251466 A1* | 8/2020 | Stockinger | ........... | H10D 89/819 |
| 2020/0294994 A1* | 9/2020 | Chen | ...................... | H10D 84/85 |
| 2021/0066287 A1* | 3/2021 | Tsai | ..................... | H10D 89/811 |
| 2021/0257833 A1* | 8/2021 | Rupp | ..................... | H02H 9/046 |
| 2021/0376601 A1* | 12/2021 | Ille | ........................ | H02H 9/046 |
| 2023/0010487 A1* | 1/2023 | Xu | ....................... | H10D 89/911 |

OTHER PUBLICATIONS

Galy, Philippe, et al.: "Deep Insights on New Embedded Resistance and Gated Diode on Thin Film Silicon BIMOS Device With and Without External Polysilicon Resistance for Advanced ESD Protection in FD-SOI Technology," Solid-State Electronics, May 30, 2021, 6 pgs.

CN Notice of Allowance for counterpart CN Appl. No. 202310056079.9, report dated Aug. 15, 2025, 4 pgs.

\* cited by examiner

ELECTROSTATIC DISCHARGE PROTECTION DEVICE

PRIORITY CLAIM

This application claims the priority benefit of French Application for Patent No. 2200347, filed on Jan. 17, 2022, the content of which is hereby incorporated by reference in its entirety to the maximum extent allowable by law.

TECHNICAL FIELD

The present disclosure generally concerns electronic devices and circuits and, more particularly, electrostatic discharge protection devices.

BACKGROUND

Issues linked to electrostatic discharge are all the more present as the components in electronic devices become smaller and smaller. The protection of electronic circuits against electrostatic discharge is an important issue to ensure the reliability and the durability of electronic devices.

There thus is a need for higher performance electrostatic discharge protection devices which are easier to implement.

SUMMARY

An embodiment overcomes all or part of the disadvantages of known electrostatic discharge protection devices.

An embodiment provides an electrostatic discharge protection device comprising only transistors.

According to an embodiment, the device comprises, between a first power supply node and a second reference node, a first clamping circuit.

According to an embodiment, the first clamping circuit comprises a first MOS-type transistor having a first conduction terminal coupled to the first node, and a second conduction terminal coupled to the second node.

According to an embodiment, the first clamping circuit further comprises a trigger module coupled to a gate terminal of the first MOS-type transistor.

According to an embodiment, the trigger module comprises: a second MOS-type transistor having a first conduction terminal coupled to the first power supply node, and a second conduction terminal coupled to the gate terminal of said first MOS-type transistor; a third MOS-type transistor having its gate terminal coupled to the first power supply node, and its two conduction terminals and its body contact terminal coupled to the gate terminal of the second transistor; and a fourth MOS-type transistor having a first gate terminal coupled to the gate of the second transistor and a second gate terminal, its two conduction terminals, and its body contact terminal coupled to the second reference node.

According to an embodiment, the trigger module comprises: a fifth MOS-type transistor having a first conduction terminal coupled to the first power supply node, and a second conduction terminal coupled to the gate terminal of said first MOS-type transistor; a sixth MOS-type transistor having a first gate terminal coupled to the first power supply node, a second gate terminal coupled to the gate terminal of the fifth transistor, and its two conduction terminals and its body contact terminal coupled to the second reference node; a seventh MOS-type transistor having a first conduction terminal and its gate coupled to the gate terminal of the fifth transistor; and an eighth MOS-type transistor having a first conduction terminal and its gate coupled to a second conduction terminal of said seventh transistor, and a second conduction terminal coupled to the second reference node.

According to an embodiment, the first clamping circuit comprises a first BiMOS-type transistor, having: a first conduction terminal coupled to the first node; a second conduction terminal coupled to the second node; and a body contact terminal coupled to a gate terminal of said first BiMOS-type transistor and to said second reference node.

According to an embodiment, the first clamping circuit comprises a second BiMOS-type transistor having: a first conduction terminal coupled to the first node; a second conduction terminal coupled to the second node; a first body contact terminal coupled to a gate terminal of said second BiMOS-type transistor; and a second body contact terminal coupled to said second reference node.

According to an embodiment, the device further comprises, between the first power supply node and a third input/output node, a first diode effect component, and between said third input/output node and the second reference node, a second diode effect component.

According to an embodiment, the first diode effect component is a ninth diode-assembled MOS-type transistor, and the second diode effect component is a tenth diode-assembled MOS-type transistor.

According to an embodiment, the first diode-effect transistor is a third BiMOS-type transistor having: a first conduction terminal coupled to the first node; a second conduction terminal coupled to the third input/output node; and a body contact terminal coupled to a gate terminal of said third BiMOS-type transistor and to said third input/output node. Furthermore, the second diode-effect component is a fourth BiMOS-type transistor having: a first conduction terminal coupled to the third input/output node; a second conduction terminal coupled to the second node; a body contact terminal coupled to a gate terminal of said fourth BiMOS-type transistor and to said second reference node.

According to an embodiment, the first diode effect component is a fifth BiMOS-type transistor having: a first conduction terminal coupled to the first node; a second conduction terminal coupled to the third input/output node; a first body contact terminal coupled to a gate terminal of said fifth BiMOS-type transistor; and a second body contact terminal coupled to said third input/output node. Furthermore, the second diode effect transistor is a sixth BiMOS-type transistor having: a first conduction terminal coupled to the third input/output node; a second conduction terminal coupled to the second node; a first body contact terminal coupled to a gate terminal of said sixth BiMOS-type transistor; and a second body contact terminal coupled to said second reference node.

According to an embodiment, the device further comprises a coupling circuit enabling to couple the electrostatic discharge protection circuit to another electrostatic discharge protection circuit.

According to an embodiment, the coupling circuit comprises an eleventh MOS-type transistor, diode-assembled between the second reference node and a fourth coupling node, and a twelfth MOS-type transistor, diode-assembled between the fourth coupling node and the second reference node, the eleventh and twelfth MOS-type transistors being assembled head-to-tail.

According to an embodiment, the coupling circuit comprises a seventh BiMOS-type transistor, diode-assembled between the second reference node and a fourth coupling node, and an eighth BiMOS-type transistor, diode-assembled between the fourth coupling node and the second reference node, the seventh and eighth BiMOS-type transistors being assembled head-to-tail.

According to an embodiment, all said BiMOS-type transistors are formed on a same substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, no application of the electrostatic discharge protection devices is detailed, usual applications are compatible with the embodiments described hereafter.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
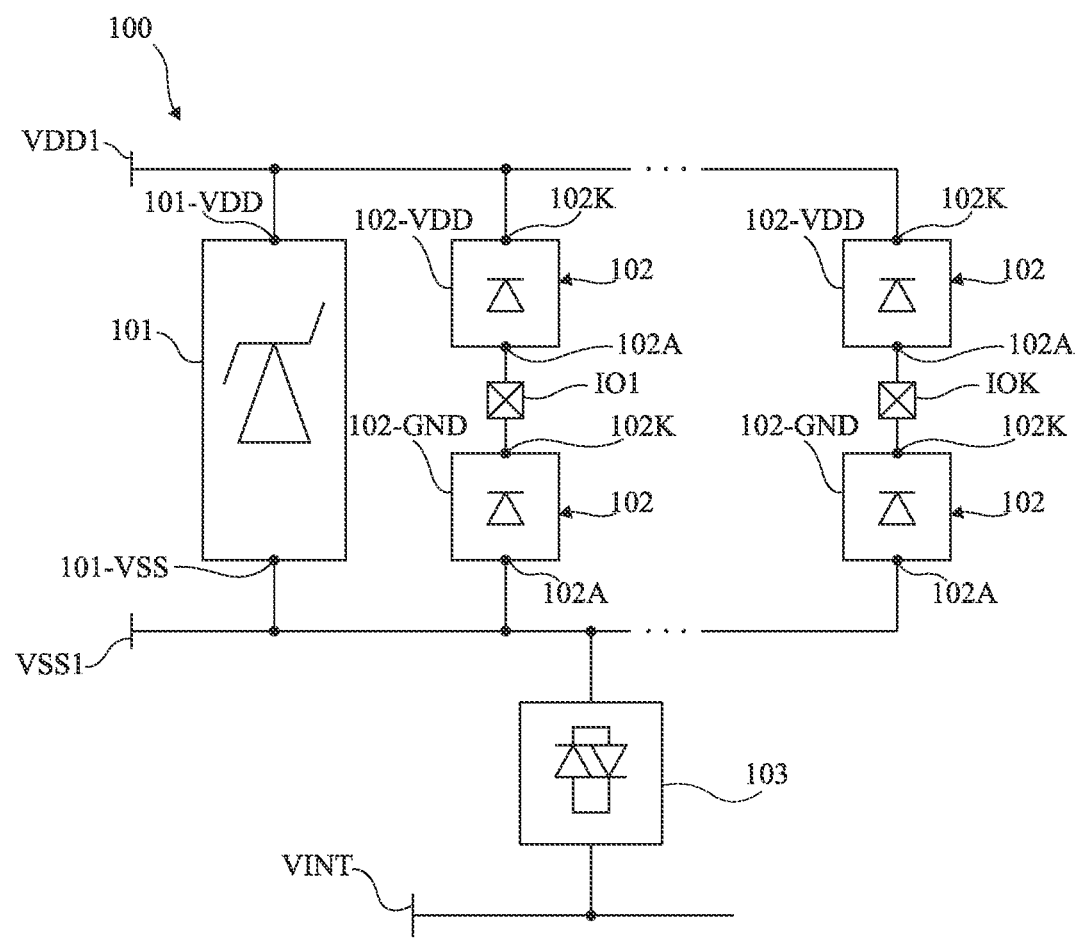
FIG. 1 very schematically shows in the form of blocks an embodiment of an electrostatic discharge protection device.

FIG. 1 very schematically shows in the form of blocks an embodiment of an electrostatic discharge protection device 100.

Device 100 is intended to be positioned between one or a plurality of power supply devices and one or a plurality of electronic devices. Device 100 enables to attenuate, or even to suppress, voltage peaks occurring at the level of one or a plurality of input/output nodes of one or a plurality of electronic devices and capable of damaging them, these voltage peaks generally being due to electrostatic discharges.

Device 100 comprises: a power supply node VDD1 adapted to receive a power supply potential from a power supply device and a reference (supply) node VSS1 adapted to receive a reference potential from the power supply device, for example, the ground. One, or a plurality, at least one, input/output nodes IO1, . . . , IOK, for example, K, K being an integer, input/output nodes, are adapted to being coupled to one or a plurality of input or output terminals of one of a plurality of electronic devices to be protected. Furthermore, one or a plurality of coupling nodes VINT are adapted to being coupled to another electrostatic discharge protection device.

According to an example, power supply node VDD1 and reference node VSS1 may be coupled, preferably connected, respectively to a power supply rail delivering a power supply potential and to a ground rail delivering a reference potential, for example, the ground.

It is here considered that the power supply potential received at the level of power supply node VDD1 is positive and greater than the reference potential received at the level of reference node VSS1.

Device 100 is formed of different circuits and components enabling it to implement an electrostatic discharge protection. Generally, electrostatic discharge protection devices comprise assemblies of electronic components among which different types of diodes are present. According to an embodiment, device 100 only comprises as electronic components transistors coupled together by electric conductors. In other words, device 100 comprises no other type of electronic component, and device 100 comprises, in particular, no diode. It is considered in this description that a conductor is not a component, even if a non-ideal conductor has an intrinsic impedance, that is, an intrinsic resistivity, an intrinsic capacitance, and an intrinsic inductance.

Device 100 is formed of: a clamping circuit 101 having a behavior similar to that of an avalanche diode; a plurality of diode effect components 102; and one or a plurality of coupling circuits 103, a single coupling circuit 103 being shown in FIG. 1.

Clamping circuit 101 is represented, in FIG. 1, by a block comprising the electronic symbol of a zener diode. Clamping circuit 101 comprises a terminal 101-VDD coupled, preferably connected, to power supply node VDD1, and a terminal 101-GND coupled, preferably connected, to reference node VSS1. Clamping circuit 101, also called clamp, is a circuit adapted to attenuating, or even to suppressing, a voltage peak capable of occurring at the level of node VDD1, for example, by directing this peak towards node VSS1. The clamping circuit may have a behavior similar to that of an avalanche diode. As previously mentioned, clamping circuit 101 only comprises, as electronic components, transistors coupled together by conductors.

Diode effect components 102 are represented, in FIG. 1, by a block comprising the electronic symbol of a conventional diode. Each diode effect component 102 is a component, or an electronic circuit, that can be likened to a biased dipole which, like a diode, only conducts the current in one direction. Thus, each diode effect component 102 comprises two terminals 102K and 102A. Diode effect components 102 conduct the current arriving on their terminal 102A and coming out through their terminal 102K, and prevent the flowing of a current arriving on their terminal 102K. In other words, terminal 102K corresponds to the cathode of a diode, and terminal 102A corresponds to the anode of a diode. As previously mentioned, diode effect components 102 are only formed of transistors coupled together by conductors.

Diode effect components 102 are positioned between an input/output (IO) node IOi, i being an integer varying from 1 to K, and power supply node VDD1 or reference node VSS1. More particularly, diode effect components 102-VDD are positioned between a node IOi and power supply node VDD1. The terminal 102K of a component 102-VDD is coupled, preferably connected, to power supply node VDD1, and the terminal 102A of a component 102-VDD is coupled, preferably connected, to input/output node IOi. Diode effect components 102-GND are positioned between a node IOi and reference node VSS1. The terminal 102K of a component 102-GND is coupled, preferably connected, to input/output node IOi, and the terminal 102A of a component 102-GND is coupled, preferably connected, to reference node VSS1.

Coupling circuit 103 is represented, in FIG. 1, by a block comprising the electronic symbol of two diodes coupled in parallel and arranged head-to-tail. Coupling circuit 103 is a circuit having the same operation as two diodes coupled in parallel and arranged head-to-tail, and enables to connect device 100 to another electrostatic discharge protection device without for it to receive the voltage peaks received by the other device. As previously mentioned, coupling circuit 103 only comprises, as electronic components, transistors coupled together by conductors.

FIGS. 2 to 8 show examples of embodiment of circuits and components of the device 100 described in relation with FIG. 1, wherein the circuits and components are formed of MOS-type transistors.

In the rest of the disclosure, a MOS-type transistor, or MOS transistor, is a metal oxide semiconductor field effect transistor, more conventionally referred to as a MOSFET. An N-channel MOS-type transistor is also referred to as an NMOS transistor. A P-channel MOS-type transistor is also referred to as a PMOS transistor. Hereafter, and unless specified otherwise, NMOS or PMOS transistors are formed in a solid substrate and insulated, or are formed on a structure of substrate on insulator (SOI) type.

FIG. 2 to 8 more particularly show examples of embodiment using NMOS transistors. Those skilled in the art will be capable of adapting the examples of these figures to PMOS transistors.

Figure 2:
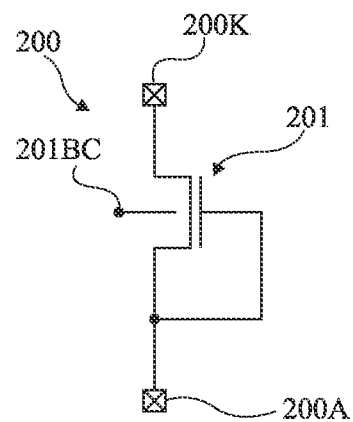
FIG. 2 shows an electric diagram of an embodiment of a portion of the device of FIG. 1.

FIG. 2 shows an electric diagram of an example embodiment of a diode effect component 200 of the type of one of the diode effect components 102 described in relation with FIG. 1.

Diode effect component 200 comprises a MOS transistor 201, for example, an NMOS transistor, diode-assembled between a node 200K, corresponding to the terminal 102K described in relation with FIG. 1, and a node 200A, corresponding to the terminal 102A described in relation with FIG. 1. More particularly, transistor 201 has one of its conduction terminals coupled, preferably connected, to node 200K, and its other conduction terminal coupled, preferably connected, to node 200A. The conduction terminal coupled to node 200K is, for example, the source of NMOS transistor 201, and the other conduction terminal coupled to node 200A is, for example, the drain of NMOS transistor 201. The gate terminal, or gate, of NMOS transistor 201 is coupled, preferably connected, to node 200A. Transistor 201 further comprises a channel contact or body contact terminal 201BC, enabling to apply a potential direction to its channel region. Here, terminal 201BC is left floating or, according to a variant, may receive a reference potential such as ground or, according to the circuit, the source if this enables to have an inactive potential.

As previously described, diode effect component 200 only comprises transistors.

Figure 3:
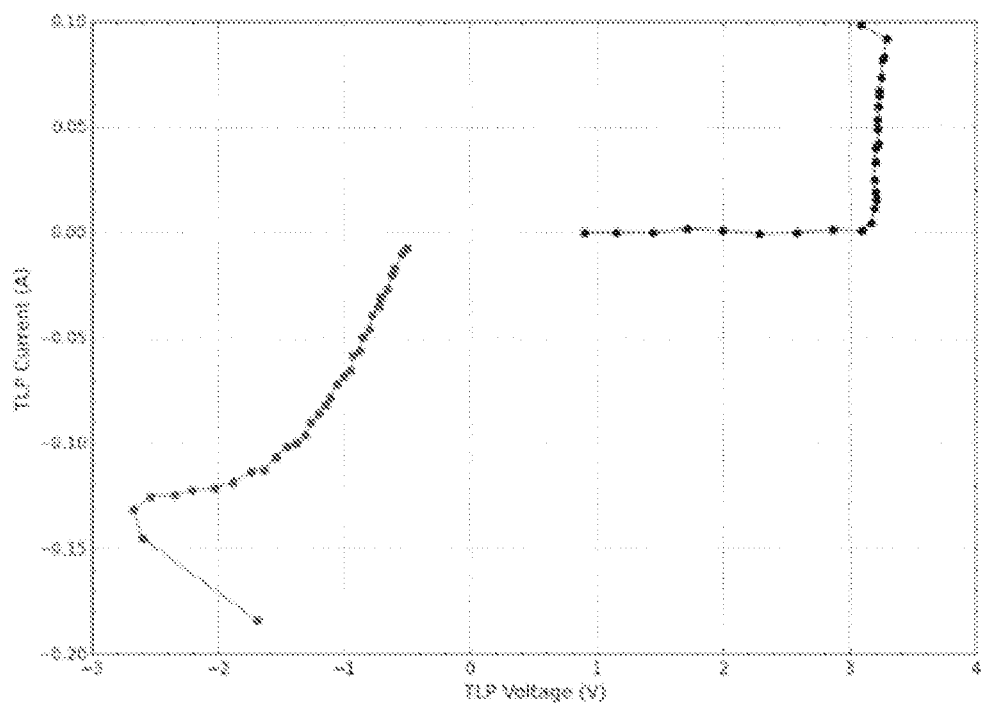
FIG. 3 shows a current-vs.-voltage characteristic of the portion of FIG. 2.

FIG. 3 shows the current-vs.-voltage characteristic of the diode effect transistor 200 described in relation with FIG. 2.

Component 200 has a current-vs.-voltage characteristic similar to the current-vs.-voltage characteristic of a diode, as shown in FIG. 3. The threshold voltage of component 200 is determined according to the structural characteristics of the component, such as its structure, its dimensions, the materials forming it, etc. An element particularly used to adjust the threshold voltage of component 200 is to partially cover the drain, source, and gate layers with a silicide layer and then to form contacting areas on this layer.

Figure 4:
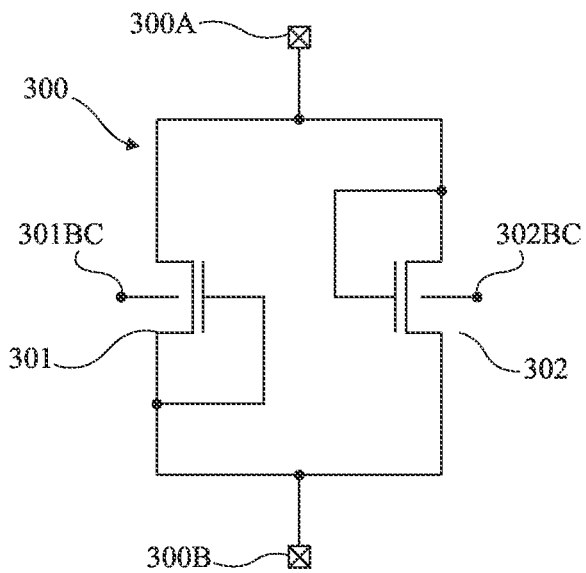
FIG. 4 shows an electric diagram of an embodiment of another portion of the device of FIG. 1.

FIG. 4 shows an electric diagram of an example of embodiment of a coupling circuit 300 of the type of one of the coupling circuits 103 described in relation with FIG. 1.

Coupling circuit 300 comprises two MOS transistors 301 and 302, for example NMOS transistors, diode-assembled, head-to-tail, between two nodes 300A and 300B of coupling circuit 300. Nodes 300A and 300B may be indifferently coupled, preferably connected, to the nodes VSS1 and VINT described in relation with FIG. 1.

More particularly, transistor 301 has one of its conduction terminals coupled, preferably connected, to node 300A, and its other conduction terminal coupled, preferably connected, to node 300B. The conduction terminal coupled to node 300A is, for example, the source of NMOS transistor 301, and the other conduction terminal coupled to node 300B is, for example, the drain of NMOS transistor 301. The gate terminal, or gate, of NMOS transistor 301 is coupled, preferably connected, to node 300A. The body contact terminal 301BC of transistor 301 is left floating or, according to a variant, may receive a reference potential such as the ground or, according to the circuit, the source if this enables to have an inactive potential.

Further, transistor 302 has one of its conduction terminals coupled, preferably connected, to node 300B, and its other conduction terminal coupled, preferably connected, to node 300A. Transistor 302 being assembled head-to-tail with transistor 301, its conduction terminal coupled to node 300B is, for example, its source, and its other conduction terminal coupled to node 300A is, for example, its drain. The gate terminal, or gate, of NMOS transistor 302 is coupled, preferably connected, to node 300A. The body contact terminal 302BC of transistor 302 is left floating or, according to a variant, may receive a reference potential such as ground or, according to the circuit, the source if this enables to have an inactive potential.

As previously described, coupling circuit 300 only comprises transistors.

Figure 5:
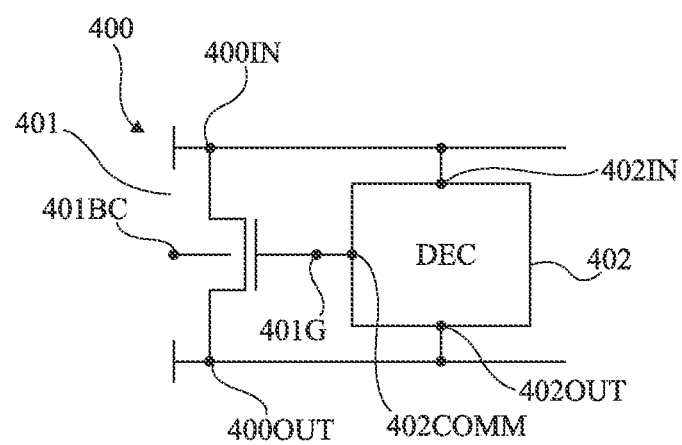
FIG. 5 schematically and partially shows in the form of blocks an embodiment of another portion of the device of FIG. 1.

FIG. 5 shows, partially in the form of blocks, an electric diagram of an example of embodiment of a clamping circuit 400 of the type of the clamping circuit 101 described in relation with FIG. 1.

Clamping circuit 400 comprises a component 401 adapted to conducting an electrostatic discharge from node 4001N to node 4000UT and a module 402 (DEC) for triggering said component 401, assembled in parallel between an input node 4001N, corresponding to the terminal 101-VDD described in relation with FIG. 1, and an output node 4000UT, corresponding to the terminal 101-VSS described in relation with FIG. 1. Input node 400IN is adapted to receiving a higher potential than output node 4000UT. According to an example, input node 400IN receives a power supply potential, and is generally coupled, preferably connected, to a power supply node of a device, and output node 4000UT receives a reference potential, and is generally coupled, preferably connected, to a reference node, such as ground, of a same device.

According to an embodiment, component 401 is a MOS transistor 401, for example, an NMOS transistor. Transistor 401 has one of its conduction terminals coupled, preferably connected, to node 400IN, and its other conduction terminal coupled, preferably connected, to node 4000UT. The conduction terminal coupled to node 400IN is, for example, the source of transistor 401, and the conduction terminal coupled to node 4000UT is, for example, the drain of transistor 401. The gate terminal, or gate, 401G of NMOS transistor 401 is coupled, preferably connected, to trigger module 402. The body contact terminal 401BC of transistor 401 is left floating or, according to a variant, may receive a reference potential such as the ground or, according to the circuit, the source if this enables to have an inactive potential. According to an embodiment, transistor 401 is a transistor having dimensions enabling it to conduct electrostatic discharges without being damaged. More precisely, transistor 401 may be a transistor of large dimensions, that is, a transistor having a gate width, for example, in the order of 1,000 μm and a gate length, for example, in the order of 28 nm. According to an embodiment, transistor 401 may be formed of a multitude of NMOS transistors coupled in parallel to one another, that is, having all their sources coupled, preferably connected, to one another, their drains coupled, preferably connected, to one another, and their gates coupled, preferably connected, to one another.

Trigger module 402 is a circuit adapted to detecting the presence of an electrostatic discharge between nodes 4001N and 400 OUT and to turning on component 401. For this purpose, trigger module 402 comprises an input terminal 402IN coupled, preferably connected, to node 400IN, an output terminal 402OUT coupled, preferably connected, to node 4000UT, and a control terminal 402COMM coupled, preferably connected, to component 401. According to an example, control terminal 402COMM is coupled, preferably connected, to the gate of transistor 401. According to an embodiment, trigger module 402 is a circuit only formed of transistors. Detailed examples of trigger module 402 are described in relation with FIGS. 6, 7, and 8.

As previously described, clamping circuit 400 only comprises transistors.

Figure 6:
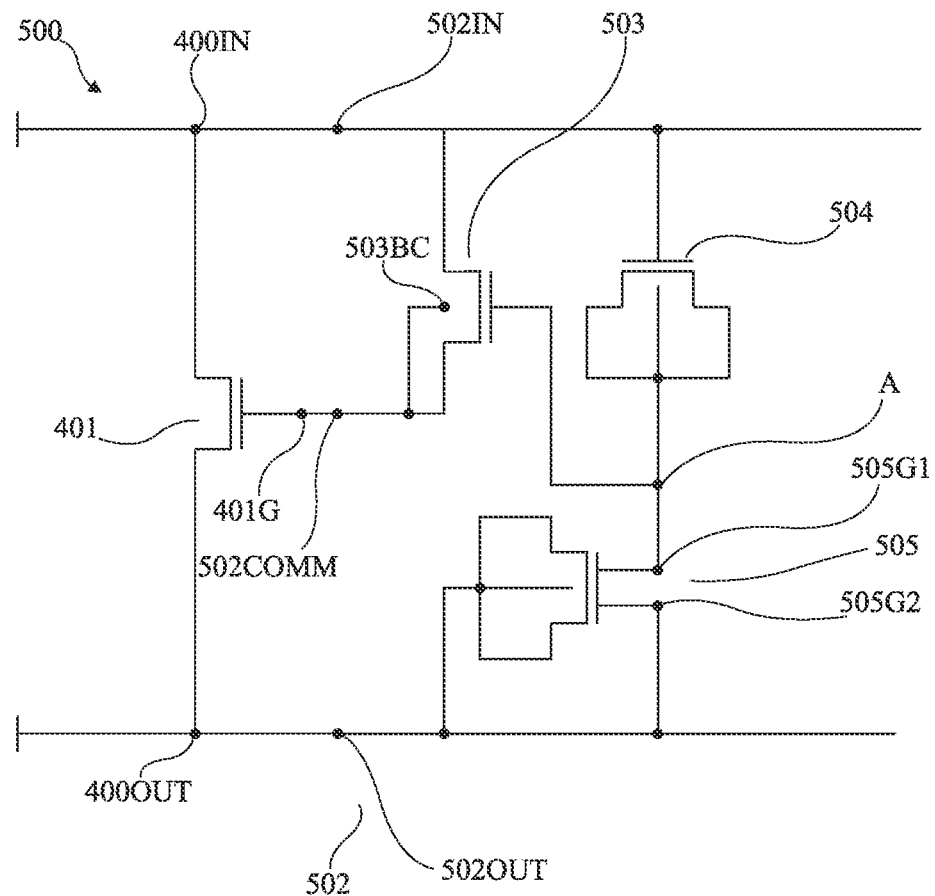
FIG. 6 shows an example of embodiment of the circuit of FIG. 5.

FIG. 6 shows, in more detailed fashion, an electric diagram of an example of embodiment of a clamping circuit 500 of the type of the clamping circuit 400 described in relation with FIG. 5, where the trigger module is detailed.

Clamping circuit 500 comprises elements common with the clamping circuit 400 of FIG. 4. In the following, these common elements will not be detailed again, and only the differences between circuits 400 and 500 will be highlighted.

Thus, like the circuit 400 described in relation with FIG. 5, circuit 500 comprises: an input terminal 400IN; an output terminal 4000UT; and a transistor 401.

Circuit 500 further comprises a trigger module 502 of the type of trigger module 402. Trigger module 502 is a circuit adapted to detecting the presence of an electrostatic discharge between nodes 400IN and 4000UT and to making component 401 conductive and is, more particularly, adapted to detecting a discharge in "dynamic" fashion. For this purpose, trigger module 502 comprises an input terminal 502IN coupled, preferably connected, to node 400IN, an output terminal 502OUT coupled, preferably connected, to node 4000UT, and a control terminal 503COMM coupled, preferably connected, to component 401. According to an example, control terminal 502COMM is coupled, preferably connected, to the gate 401G of transistor 401.

Trigger module 502 comprises: a MOS transistor 503, for example, an NMOS transistor; a MOS transistor 504, for example, an NMOS transistor, assembled as a capacitor; and a MOS transistor 505, for example, an NMOS transistor, assembled as a resistor.

Transistor 503 has one of its conduction terminals coupled, preferably connected, to input node 502IN, and its other conduction terminal coupled, preferably connected, to node 502COMM. The conduction terminal coupled to node 502IN is, for example, the drain of transistor 503, and its other conduction terminal coupled to node 502COMM is, for example, the source of transistor 503. The gate of NMOS transistor 503 is coupled, preferably connected, to a node A. The body contact terminal 503BC of transistor 503 is coupled, preferably connected, to the source of transistor 503, that is, terminal 502COMM.

Transistor 504 is assembled as a capacitor between node 502IN and node A. For this purpose, the gate of transistor 504 is coupled, preferably connected, to node 502IN, and the two conduction terminals and the body contact terminal of transistor 504 are, all three, coupled to one another and to node A. Thereby, transistor 504 is equivalent to a capacitor having as a capacitance the inner capacitance of transistor 504.

Transistor 505 is assembled as a resistor between node A and node 502OUT. For this purpose, transistor 505 comprises two gate terminals each corresponding to a contacting area on the gate region of transistor 505. This is described in further detail in relation with FIG. 7. A first gate terminal 505G1 is coupled, preferably connected, to node A, and a second gate terminal 505G2 is coupled, preferably connected, to node 502OUT. The two conduction terminals and the body contact terminal of transistor 505 are, all three, coupled to one another and to node 502OUT. Thereby, transistor 505 is equivalent to a resistor having as a resistance the resistance of the portion of the gate region of transistor 505 located between the two contacting areas corresponding to terminals 505G1 and 505G2, as described in relation with FIG. 7.

The operation of trigger module 502 is the following. When an electrostatic discharge occurs at the level of node 4001N, that is, when a potential peak occurs at the level of node 4001N, and since transistors 504 and 505 form an RC-type circuit, the potential at the level of node A increases sufficiently to turn on transistor 503. By turning on, transistor 503 sends the potential peak onto the gate of transistor 401, which turns it on and enables it to conduct the potential peak all the way to output node 4000UT.

As previously described, trigger module 500 only comprises transistors.

Figure 7:
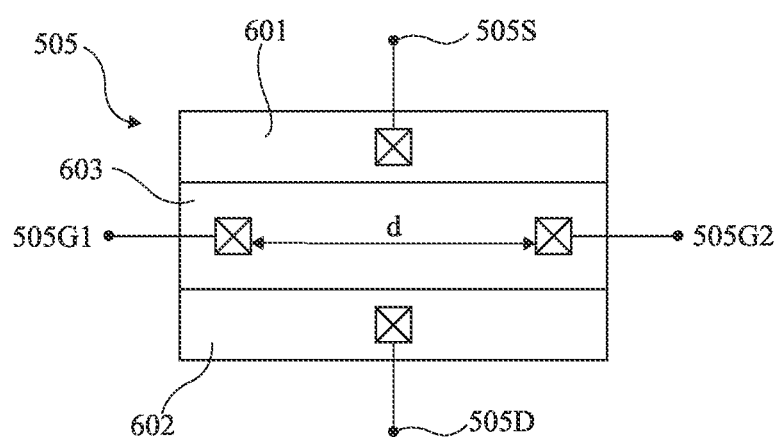
FIG. 7 shows a top view of a component of the circuit of FIG. 6.

FIG. 7 is a top view of an example of embodiment of the transistor 505 described in relation with FIG. 6.

Transistor 505 may, for example, have an elongated shape and comprise source 601, drain 602, and gate 603 regions of substantially rectangular shape. On the source 601 and drain 602 regions, contacts are formed, respectively, a source contact coupled, preferably, connected, to a node 505S, and a drain contact coupled, preferably connected, to a node 505D. A plurality of contacts may be formed on each of its regions and be connected to one another.

At least one first gate contact coupled, preferably connected, to node 505G1 and at least one second gate contact coupled, preferably connected, to node 505G2 are formed on the gate region 603 of transistor 505. These contacts are spaced apart from each other by a distance d and are not coupled to one another. When transistor 505 is assembled as a resistor, its resistivity is, among others, a function of distance d and of the presence (or not) of silicide on the gate, generally made of polysilicon, of transistor 505 as previously described.

Figure 8:
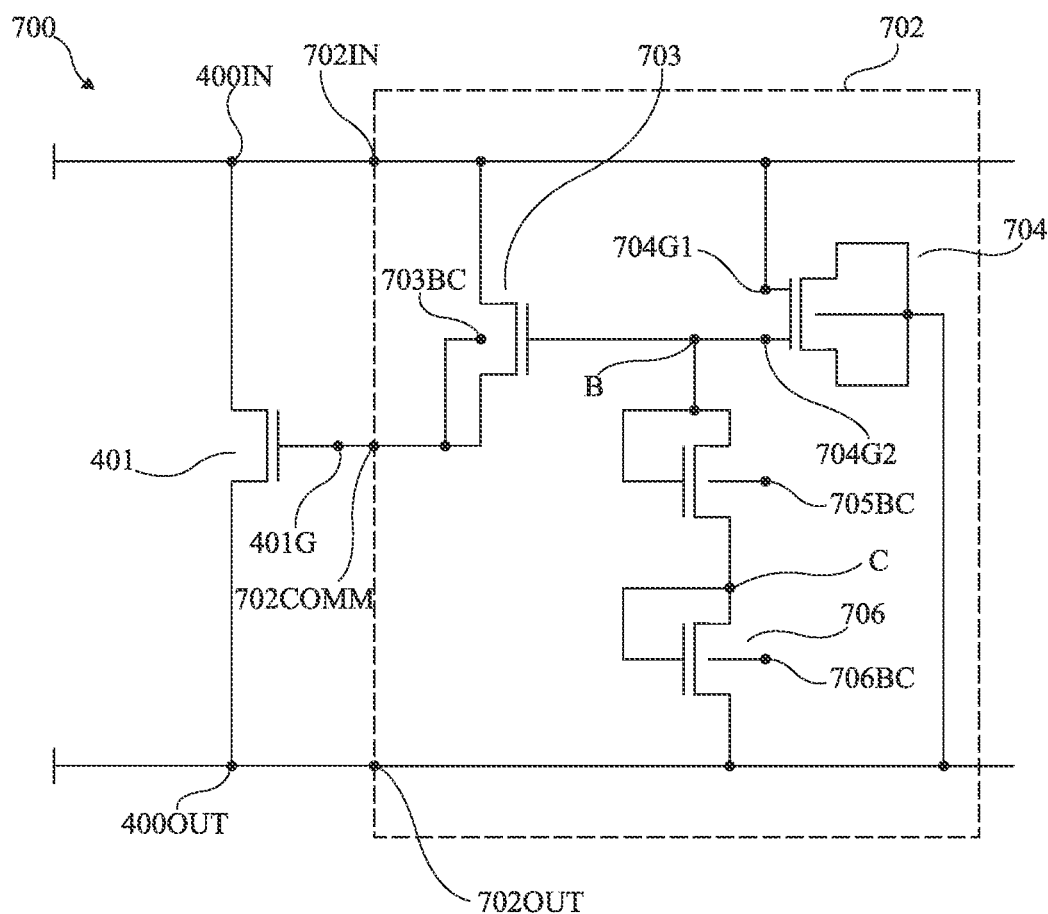
FIG. 8 shows another example of embodiment of the circuit of FIG. 5.

FIG. 8 shows, in more detailed fashion, an electric diagram of another example of embodiment of a clamping circuit 700 of the type of the clamping circuit 400 described in relation with FIG. 5, where the trigger module is detailed.

Clamping circuit 700 comprises elements common with the clamping circuit 400 of FIG. 4. In the following, these common elements will not be detailed again, and only the differences between circuits 400 and 700 will be highlighted.

Thus, like the circuit 400 described in relation with FIG. 5, circuit 700 comprises: an input terminal 400IN; an output terminal 400OUT; and a transistor 401.

Circuit 700 further comprises a trigger module 702 of the type of trigger module 402. Trigger module 702 is a circuit adapted to detecting the presence of an electrostatic discharge between nodes 400IN and 400OUT and to making component 401 conductive and is, more particularly, adapted to detecting a discharge in "static" fashion. For this purpose, trigger module 702 comprises an input terminal 702IN coupled, preferably connected, to node 400IN, an output terminal 702OUT coupled, preferably connected, to node 400OUT, and a control terminal 702COMM coupled, respectively connected, to component 401. According to an example, control terminal 702COMM is coupled, preferably connected, to the gate of transistor 401.

Trigger module 702 comprises: a MOS transistor 703, for example, an NMOS transistor; a MOS transistor 704, for example, an NMOS transistor, assembled as a resistor; a MOS transistor 705, for example, an NMOS transistor, diode assembled; and a MOS transistor 706, for example, an NMOS transistor, diode assembled.

Transistor 703 has one of its conduction terminals coupled, preferably connected, to input node 702IN, and its other conduction terminal coupled, preferably connected, to node 702COMM. The conduction terminal coupled to node 702IN is, for example, the drain of transistor 703, and its other conduction terminal coupled to node 702COMM is, for example, the source of transistor 703. The gate of NMOS transistor 703 is coupled, preferably connected, to a node B. The body contact terminal 703BC of transistor 302 is coupled, preferably connected, to the source of transistor 703, that is, terminal 702COMM.

Transistor 704 is assembled as a resistor between node 702IN and node B and is of the same type as the transistor 505 described in relation with FIGS. 6 and 7. Thus, transistor 704 comprises two gate terminals, each corresponding to a contacting area on the gate region of transistor 704. A first gate terminal 704G1 is coupled, preferably connected, to node 7021N, and a second gate terminal 704G2 is coupled, preferably connected, to node B. The two conduction terminals and the body contact terminal of transistor 704 are, all three, coupled to one another and to node 702OUT.

Thereby, transistor 704 is equivalent to a resistor having as a resistance the resistance of the portion of the gate region of transistor 704 located between the two contacting areas corresponding to terminals 704G1 and 704G2.

Transistor 705 and transistor 706 are diode-assembled, in series between nodes B and 702OUT.

More particularly, transistor 705 has one of its conduction terminals coupled, preferably connected, to a node C and its other conduction terminal coupled, preferably connected, to node B. The conduction terminal coupled to node C is, for example, the source of NMOS transistor 705, and the other conduction terminal coupled to node B is, for example, the drain of NMOS transistor 705. The gate terminal, or gate, of NMOS transistor 705 is coupled, preferably connected, to node B. The body contact terminal 705BC of transistor 705 is left floating or, according to a variant, may receive a reference potential such as the ground or, according to the circuit, the source if this enables to have an inactive potential.

Further, transistor 706 has one of its conduction terminals coupled, preferably connected, to a node 702OUT, and its other conduction terminal coupled, preferably connected, to node C. The conduction terminal coupled to node 702OUT is, for example, the source of NMOS transistor 706, and the other conduction terminal coupled to node C is, for example, the drain of NMOS transistor 706. The gate terminal, or gate, of NMOS transistor 706 is coupled, preferably connected to node C. The body contact terminal 706BC of transistor 706 is left floating or, according to a variant, may receive a reference potential such as the ground or, according to the circuit, the source if this enables to have an inactive potential.

The operation of trigger module 702 is the following. When an electrostatic discharge occurs at the level of node 400IN, the potential at the level of node B increases sufficiently to turn on transistor 703. The resistivity of transistor 704 and the voltage drops of diode-assembled transistors 705 and 706 are adjusted so that the potential at the level of node B only turns on transistor 703 if an electrostatic discharge occurs on node 702IN. By turning on, transistor 503 sends the potential peak onto the gate of transistor 401, which turns it on and enables it to conduct the potential peak to output node 400OUT.

As previously described, trigger module 500 only comprises transistors.

FIGS. 9 to 12 show examples of embodiment of the circuits and components of the device 100 described in relation with FIG. 1, where the circuits and components are formed of BiMOS-type transistors.

In the rest of the disclosure, call BiMOS-type transistor a transistor combining the features of a bipolar transistor and of a MOS transistor. A BiMOS transistor has a structure of the type of that of a MOS transistor but further comprises a channel contact or base contact, or body contact, coupled to its channel region. It will be spoken of an N-type BiMOS-type transistor for a transistor having the same structure as an NMOS transistor, and of a P-type BiMOS transistor for a transistor having the same structure as a PMOS transistor.

FIGS. 9 to 12 more particularly show examples of embodiment using N-type BiMOS transistors. Those skilled in the art will be capable of adapting the examples of these drawings to P-type BiMOS transistors.

Figure 9:
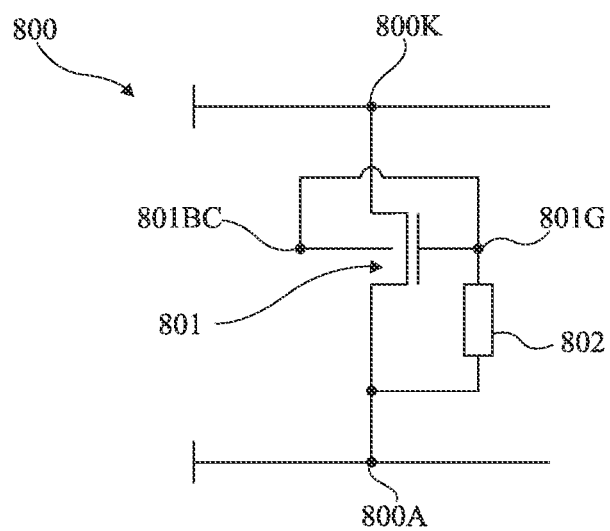
FIG. 9 shows an electric diagram of an embodiment of a portion of the device of FIG. 1.

FIG. 9 shows an electric diagram of an example of embodiment of a diode effect component 800.

Component 800 comprises an N-type BiMOS transistor 801. Transistor 801 is diode-assembled between a node 800K and a node 800A. More particularly, transistor 801 has one of its conduction terminals coupled, preferably connected, to node 800K, and its other conduction terminal coupled, preferably connected, to node 800A. The conduction terminal coupled to node 800K is, for example, the source of NMOS transistor 801, and the other conduction terminal coupled to node 800A is, for example, the drain of NMOS transistor 801. The gate 801G of NMOS transistor 801 is coupled, preferably connected to node 800A. For the following, there is represented by a resistor 802 the resistivity of the conductor coupling gate 801G to node 800A. By modifying resistor 802, that is, by modifying the quantity of conductor used to couple terminal 801G and 8000UT, it is possible to adjust the breakdown voltage of transistor 801. Further, as previously mentioned, transistor 801 comprises a body contact terminal 801BC. Here, terminal 801BC is coupled, preferably connected, to the gate 801G of transistor 801.

Diode effect component 800 has the same behavior as a zener diode and may be used in the device 100 described in relation with FIG. 1 as a clamping circuit 101 and as a diode effect component 102. When diode effect component 800 is used as a clamping circuit, node 800K corresponds to the terminal 101-VDD described in relation with FIG. 1, and node 800A corresponds to the terminal 101-VSS described in relation with FIG. 1. When diode effect component 800 is used as a diode effect component, node 800K corresponds to the terminal 102K described in relation with FIG. 1 and node 800A corresponds to the terminal 102A described in relation with FIG. 1. By being coupled head-to-tail with another identical component, diode effect component 800 may be used in a coupling circuit of the type of the circuit 103 described in relation with FIG. 1.

As previously described, diode effect component 800 only comprises transistors.

Figure 10:
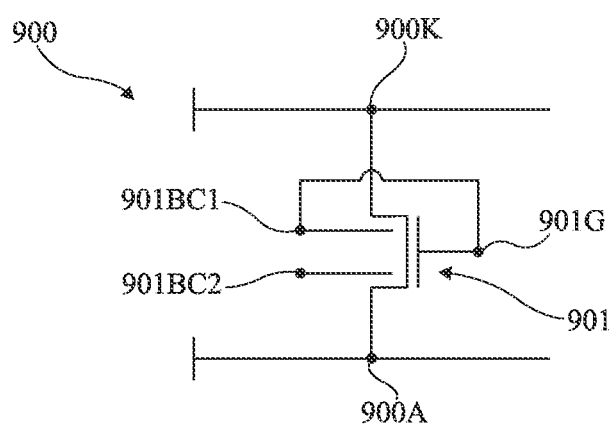
FIG. 10 shows an electric diagram of an embodiment of a portion of the device of FIG. 1.

FIG. 10 shows an electric diagram of an example of embodiment of a diode effect component 900.

Component 900 comprises an N-type BiMOS transistor 901. Transistor 901 is diode-assembled between a node 900K and a node 900A. More particularly, transistor 901 has one of its conduction terminals coupled, preferably connected, to node 900K, and its other conduction terminal coupled, preferably connected, to node 900A. The conduction terminal coupled to node 900K is, for example, the source of NMOS transistor 901, and the other conduction terminal coupled to node 900A is, for example, the drain of NMOS transistor 901. The gate 901G of NMOS transistor 901 is coupled, preferably connected, to node 900A. Unlike the transistor 801 described in relation with FIG. 9, transistor 901 comprises two channel contact terminals 901BC1 and 901BC2. Terminal 901BC1 is coupled, preferably connected, to the gate 901G of transistor 901, and terminal 901BC2 is coupled, preferably connected, to node 900A. As for the two gate terminals of the transistor 505 described in relation with FIG. 6 or transistor 704 described in relation with FIG. 8, the two body contact terminals of transistor 901 are, in practice, two contacts formed distantly on the channel region of transistor 901. An example of embodiment of transistor 901 is described in relation with FIG. 11.

Diode effect component 900 may be used in the device 100 described in relation with FIG. 1 as a clamping circuit 101 and as a diode effect component 102. When diode effect component 900 is used as a clamping circuit, node 900K corresponds to the terminal 101-VDD described in relation with FIG. 1, and node 900A corresponds to the terminal 101-VSS described in relation with FIG. 1. When diode effect component 900 is used as a diode effect component, node 900K corresponds to the terminal 102K described in relation with FIG. 1 and node 900A corresponds to the terminal 102A described in relation with FIG. 1. By being coupled head-to-tail with another identical component, diode effect component 900 may be used in a coupling circuit of the type of the circuit 103 described in relation with FIG. 1.

As previously described, diode effect component 800 only comprises transistors.

Figure 11:
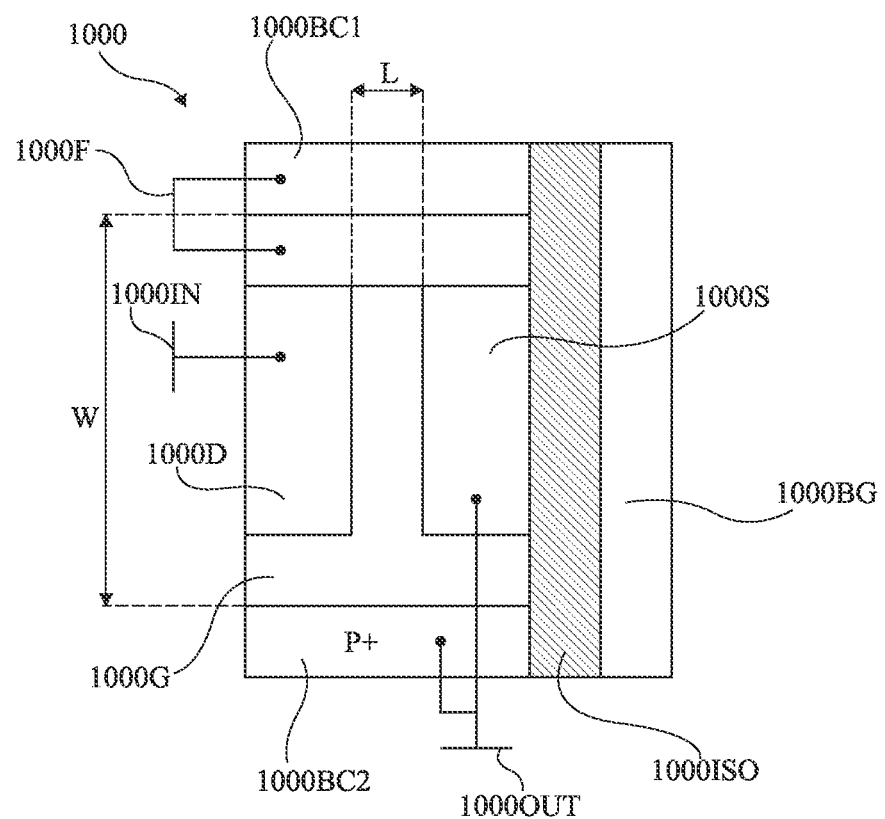
FIG. 11 shows a top view of a component of the circuit of FIG. 10.

FIG. 11 is atop view of an embodiment of a BiMOS transistor 1000 formed inside and on top of an SOI structure, and more particularly, inside and on top of a FDSOI structure. BiMOS transistor 1000 is a practical example of embodiment of the transistor 901 described in relation with FIG. 10.

Transistor 1000 comprises: a very heavily-doped N-type (N+) source region 1000S; a very heavily doped N-type (N+) drain region 1000D; a channel region (not shown in FIG. 2) topped with a gate stack, or gate region 1000G; a very heavily P-type doped (P+) substrate contact region 1000BG; and two very heavily P-type doped (P+) body contact regions 1000BC1 and 1000BC2.

As usual, the following terms are used: lightly-doped semiconductor layer designates a layer having a dopant atom concentration in the range from $1\times10^{14}$ to $5\times10^{17}$ atoms/cm$^3$; heavily-doped semiconductor layer designates a layer having a dopant atom concentration in the range from $5\times10^{17}$ to $1\times10^{18}$ atoms/cm$^3$; and very heavily doped semiconductor layer designates a layer having a dopant atom concentration in the range from $1\times10^{18}$ to $1\times10^{21}$ atoms/cm$_3$.

Channel and gate regions 1000G have, in top view, the shape, for example, of a lazy H. More particularly, channel and gate regions 1000G comprise two parallel branches and one central branch perpendicular to the two others. The central branch couples the two parallel branches. The main branch has a thickness corresponding to gate length L. Channel and gate regions 1000G have a length corresponding to gate width W (see FIG. 11).

Source and drain regions 1000S and 1000D are arranged on either side of the main branch of the channel region, between the branches parallel to each other. Source and drain regions 1000S and 1000D have, in top view, for example a rectangular shape.

The two body contact regions 1000BC1 and 1000BC2 are arranged on either side of the channel and gate regions 1000G, and more particularly arranged on the outer side of the two parallel branches of the channel and gate regions 1000G. In other words, each channel contact region is arranged at one end of transistor 1000.

Substrate contact region 1000BG is arranged on one side of transistor 1000, and is separated from the other regions by an insulating region 1000ISO. Regions 1000ISO and 1000BG have, in top view, a shape, for example, rectangular, extending alongside the other regions.

A use of transistor 1000 as a diode effect component or as a clamping circuit in the device 100 described in relation with FIG. 1 may be performed as follows.

Drain region 1000D is coupled, preferably connected, to an input node 1000IN. Source region 1000S is coupled, preferably connected, to an output node OUT. Output node 10000UT may, for example, be capable of receiving a reference potential, for example, the ground. Body contact region 1000BC1 is coupled, preferably connected, to gate region 1000G via one or a plurality of wires or vias 1000F. Channel contact region 1000BC2 is coupled, preferably connected, to output node 10000UT.

An advantage of transistor 100 is that it is possible to adjust the trigger voltage of transistor 1000, that is, the voltage to be applied between source and drain regions 1000S and 1000D to turn on transistor 1000, by only adjusting the inner resistance R of the channel region of transistor 1000. Indeed, the more the inner resistance of the channel region increases, the more the trigger voltage decreases.

Indeed, the inner resistance R of the channel region of transistor 1000 is defined by the following formula:

$$R = \frac{\rho L}{(W * T)}$$

where: ρ designates the resistivity of the material of the channel region; L designates the length of the channel region; W designates the width of the channel region; and T designates the channel thickness in a direction orthogonal to the plane of the drawing, in the case where transistor 1000 is formed in a FDSOI-type structure but may be also envisaged in the case where transistor 1000 is formed (and insulated) in a solid substrate.

It is thus possible to vary four different parameters to adjust the trigger voltage of transistor 1000.

As an example, it is possible to modify inner resistance R by forming an opening in the buried insulating layer of the FDSOI structure having the transistor formed therein. Thus, the resistance of the substrate of the structure has an influence upon the resistance of the channel region.

It is also possible to modify the resistance of the channel region by applying a positive or negative potential between substrate region 1000BG and output node 10000UT. Indeed, a biasing of the substrate may enable, by capacitive effect with the buried insulating layer of the SOI structure, to modify the resistance of the channel region. In particular, a negative biasing of the channel region may enable to decrease the inner resistance of the channel region. This is only possible when the transistor is formed inside and on top of a SOI structure.

As an example, it is possible to decrease inner resistance R by decreasing the length L of the channel region.

As an example, it is possible to decrease inner resistance R by increasing the width W of the channel region. The modification of this parameter may also modify the thermal voltage of the transistor.

Another advantage of the transistor 1000 described in relation with FIG. 11 is that it further comprises a parasitic diode between terminals 1000IN and 10000UT enabling to filter negative electrostatic discharges. More particularly, this diode is formed by the P-type doped body contact region 1000BC2 and the P-type doped channel region (anode of the parasitic diode), and by the N-type doped drain region 1000D (cathode of the parasitic diode).

Figure 12:
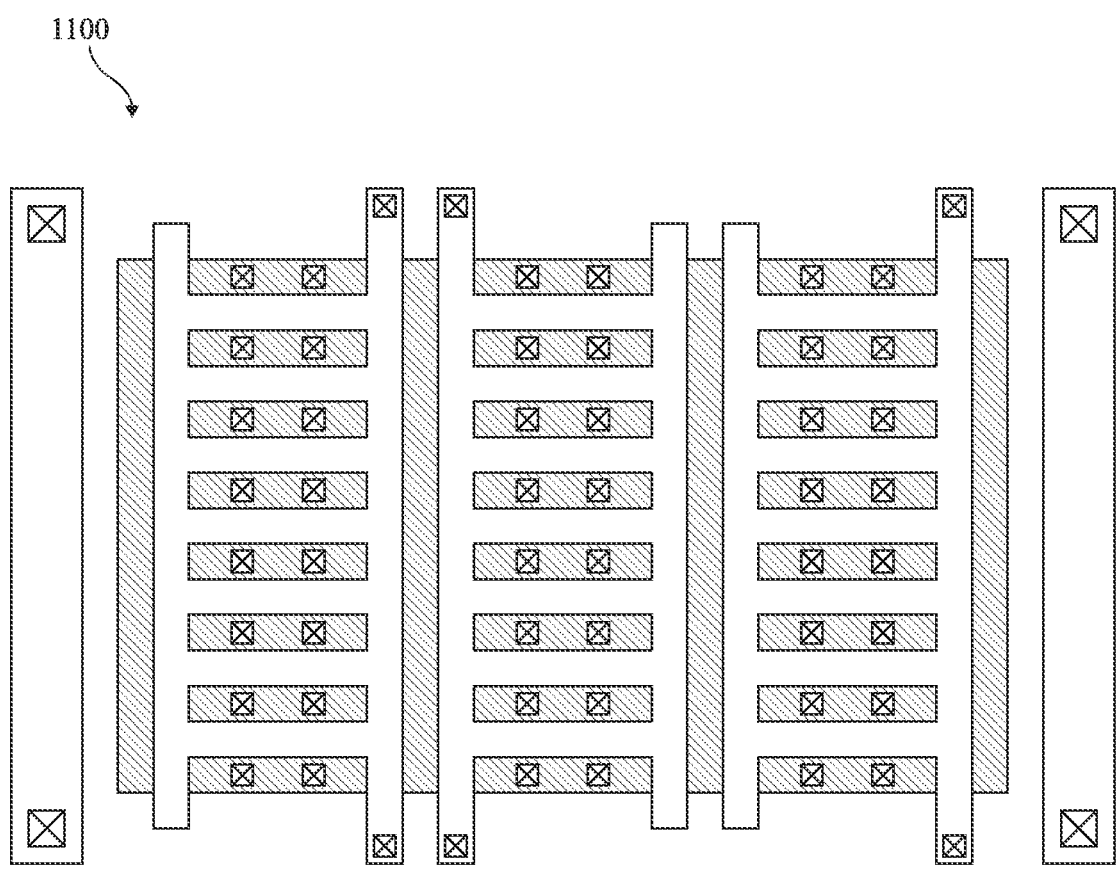
FIG. 12 shows a top view of an example of embodiment of a structure of the circuit of FIG. 10.

FIG. 12 is a top view of an embodiment of a structure 1100 comprising a plurality of BiMOS transistors of the type of the transistor 1000 described in relation with FIG. 11. Structure 1100 is another practical example of embodiment of the component 900 described in relation with FIG. 10.

Structure 1100 comprises a plurality of BiMOS transistors, of the type of the BiMOS transistor 1000 described in relation with FIG. 11, formed on said SOI structure and having, for some of them, gate regions coupled to one another in a structure. More particularly, the transistors in the structure are arranged in rows and in columns, the transistors of a same column having a "common" gate, in other words all their gate regions are formed in a single block.

An advantage of this structure 1100 is that by adapting the connections between the different BiMOS transistors, structure 1100 may enable to form, on a same SOI- or FDSOI-type structure, an electrostatic discharge protection device of the type of the device 100 described in relation with FIG. 1.

Various embodiments and variants have been described. Those skilled in the art will understand that certain features of these various embodiments and variants may be combined, and other variants will occur to those skilled in the art. In particular, the device may comprise transistors of different types to form the different elements which form it, for example, MOS transistors and BiMOS transistors.

Finally, the practical implementation of the described embodiments and variations is within the abilities of those skilled in the art based on the functional indications given hereabove.

The invention claimed is:

1. An electrostatic discharge protection device, comprising a clamping circuit formed only of electrically connected transistors including:
   a first MOS-type transistor having a first conduction terminal coupled to a first supply node, and a second conduction terminal coupled to a second supply node;
   a second MOS-type transistor having a first conduction terminal coupled to the first supply node, and a second conduction terminal coupled to a gate terminal of said first MOS-type transistor; and
   a third MOS-type transistor having first and second conduction terminals coupled to the second supply node, a first gate terminal coupled to a gate terminal of the second MOS-type transistor, and a second gate terminal coupled to one of the first and second supply nodes.

2. The device according to claim 1, wherein a body contact terminal of the third MOS-type transistor is coupled to the second supply node.

3. The device according to claim 1, wherein said second gate terminal of the third MOS-type transistor is coupled to the second supply node, and further including: a fourth MOS-type transistor having first and second conduction terminals coupled to the gate terminal of the second MOS-type transistor, and a gate terminal coupled to the first supply node.

4. The device according to claim 3, wherein a body contact terminal of the fourth MOS-type transistor is coupled to the gate terminal of the second MOS-type transistor.

5. The device according to claim 3, wherein the second, third and fourth MOS-type transistors form a trigger circuit configured to generate a trigger signal applied to the gate terminal of said first MOS-type transistor to control turn on of said first MOS-type transistor, wherein the trigger signal is generated by the trigger circuit in response to an electrostatic discharge event at one or more of the first and second supply nodes.

6. The device according to claim 3, wherein the fourth MOS-type transistor comprises an N-type BiMOS transistor.

7. The device according to claim 1, wherein said second gate terminal of the second MOS-type transistor is coupled to the first supply node, and further including: a fifth MOS-type transistor having a first conduction terminal and a gate coupled to the gate terminal of the second MOS-type transistor; and a sixth MOS-type transistor having a first conduction terminal and a gate coupled to a second conduction terminal of said fifth MOS-type transistor, and a second conduction terminal coupled to the second supply node.

8. The device according to claim 7, wherein body contacts of the first and sixth MOS-type transistors are left floating.

9. The device according to claim 7, wherein body contacts of the first and sixth MOS-type transistors are coupled to a reference potential.

10. The device according to claim 9, wherein the reference potential is a ground potential.

11. The device according to claim 7, wherein each of the fifth and sixth MOS-type transistors is an N-type BiMOS transistor.

12. The device according to claim 7, wherein the second, third, fifth and sixth MOS-type transistors form a trigger circuit configured to generate a trigger signal applied to the gate terminal of said first MOS-type transistor to control turn on of said first MOS-type transistor, wherein said trigger signal is generated by the trigger circuit in response to an electrostatic discharge event at one or more of the first and second supply nodes.

13. The device according to claim 1, further comprising:
an input/output node;
a first diode effect component coupled between the first supply node and the input/output node; and
a second diode effect component coupled between said input/output node and the second supply node.

14. The device according to claim 13:
wherein the first diode effect component comprises a first diode-assembled MOS-type transistor; and
wherein the second diode effect component comprises a second diode-assembled MOS-type transistor.

15. The device according to claim 14, wherein each of the first and second diode-assembled MOS-type transistor are implemented as an n-type BiMOS transistor.

16. The device according to claim 1, further comprising a coupling circuit configured to couple the second supply node to a further supply node of another electrostatic discharge protection device.

17. The device according to claim 16, wherein the coupling circuit comprises:
a third diode-assembled MOS-type transistor and a fourth diode-assembled MOS-type transistor connected head-to-tail between the second supply node and the further supply node.

18. The device according to claim 1, wherein the first MOS-type transistor is an n-type BiMOS transistor.

* * * * *